United States Patent
Lee

(10) Patent No.: US 8,257,799 B2
(45) Date of Patent: Sep. 4, 2012

(54) METHOD FOR FORMING THIN FILM USING RADICALS GENERATED BY PLASMA

(75) Inventor: Sang In Lee, Sunnyvale, CA (US)

(73) Assignee: Synos Technology, Inc., Fremont, CA (US)

( * ) Notice: Subject to any disclaimer, the term of this patent is extended or adjusted under 35 U.S.C. 154(b) by 268 days.

(21) Appl. No.: 12/709,763

(22) Filed: Feb. 22, 2010

(65) Prior Publication Data
US 2010/0215871 A1 Aug. 26, 2010

Related U.S. Application Data

(60) Provisional application No. 61/154,664, filed on Feb. 23, 2009.

(51) Int. Cl.
H05H 1/24 (2006.01)
C23C 16/00 (2006.01)

(52) U.S. Cl. ............... 427/569; 427/255.28; 427/255.7

(58) Field of Classification Search .......... 427/569, 427/576
See application file for complete search history.

(56) References Cited

U.S. PATENT DOCUMENTS

| | | | |
|---|---|---|---|
| 5,665,640 A * | 9/1997 | Foster et al. ............ | 438/680 |
| 6,435,428 B2 | 8/2002 | Kim et al. | |
| 6,521,048 B2 * | 2/2003 | Miller et al. ............ | 118/729 |
| 6,656,831 B1 | 12/2003 | Lee et al. | |
| 6,730,614 B1 * | 5/2004 | Lim et al. ............... | 438/763 |
| 2002/0100418 A1 | 8/2002 | Sandhu et al. | |
| 2002/0112819 A1 | 8/2002 | Kamarehi et al. | |
| 2002/0197864 A1 | 12/2002 | Sneh | |
| 2003/0143328 A1 * | 7/2003 | Chen et al. ............ | 427/255.28 |
| 2004/0083967 A1 | 5/2004 | Yuda et al. | |
| 2004/0129212 A1 | 7/2004 | Gadgil et al. | |
| 2004/0224527 A1 | 11/2004 | Sarigiannis et al. | |
| 2004/0247787 A1 | 12/2004 | Mackie et al. | |
| 2004/0261946 A1 | 12/2004 | Endoh et al. | |
| 2005/0106094 A1 * | 5/2005 | Kondo ................... | 423/447.1 |
| 2006/0183301 A1 | 8/2006 | Yeom et al. | |
| 2006/0211243 A1 | 9/2006 | Ishizaka et al. | |
| 2006/0213441 A1 | 9/2006 | Kobrin et al. | |
| 2006/0240665 A1 | 10/2006 | Kang et al. | |

(Continued)

FOREIGN PATENT DOCUMENTS

EP 0188208 A2 7/1986

(Continued)

OTHER PUBLICATIONS

PCT International Search Report and Written Opinion, PCT Application No. PCT/US11/44470, Dec. 7, 2011, 13 pages.

(Continued)

Primary Examiner — David Turocy
(74) Attorney, Agent, or Firm — Fenwick & West LLP

(57) ABSTRACT

A method for forming a thin film using radicals generated by plasma may include generating radicals of a reactant precursor using plasma; forming a first thin film on a substrate by exposing the substrate to a mixture of the radicals of the reactant precursor and a source precursor; exposing the substrate to the source precursor; and forming a second thin film on the substrate by exposing the substrate to the mixture of the radicals of the reactant precursor and the source precursor. Since the substrate is exposed to the source precursor between the formation of the first thin film and the formation of the second thin film, the rate of deposition may be improved.

18 Claims, 13 Drawing Sheets

U.S. PATENT DOCUMENTS

| | | |
|---|---|---|
| 2008/0026162 A1 | 1/2008 | Dickey et al. |
| 2008/0092953 A1 | 4/2008 | Lee |
| 2008/0260963 A1 | 10/2008 | Yoon et al. |
| 2009/0044661 A1 | 2/2009 | Li et al. |
| 2009/0133714 A1 | 5/2009 | Yamazaki et al. |
| 2009/0165715 A1 | 7/2009 | Oh |
| 2010/0037820 A1 | 2/2010 | Lee |
| 2010/0037824 A1 | 2/2010 | Lee |
| 2010/0064971 A1 | 3/2010 | Lee |
| 2010/0068413 A1 | 3/2010 | Lee |
| 2010/0181566 A1 | 7/2010 | Lee |
| 2010/0255625 A1 | 10/2010 | De Vries |

FOREIGN PATENT DOCUMENTS

| | | | |
|---|---|---|---|
| JP | 09-199738 A | | 7/1997 |
| JP | 11-092943 A | | 4/1999 |
| JP | 2003-073835 A | | 3/2003 |
| JP | 2003073835 A | * | 3/2003 |
| JP | 2003-324070 | | 11/2003 |
| JP | 2004091837 A | * | 3/2004 |
| JP | 2005-116898 | | 4/2005 |
| JP | 2005-347245 A | | 5/2005 |
| JP | 2007-191792 A | | 8/2007 |
| KR | 100175011 B1 | | 11/1998 |
| KR | 10-2001-0040561 | | 5/2001 |
| KR | 10-2002-0078804 | | 10/2002 |
| KR | 10-2002-0083564 A | | 11/2002 |
| KR | 10-0631972 | | 8/2003 |
| KR | 10-2004-0042209 A | | 5/2004 |
| KR | 10-2005-0015931 A | | 2/2005 |
| KR | 10-0542736 | | 1/2006 |
| KR | 10-2006-0117607 | | 11/2006 |
| KR | 10-0673211 B1 | | 1/2007 |
| KR | 10-2007-0051332 A | | 5/2007 |
| KR | 10-2007-0076955 A | | 7/2007 |
| KR | 10-2007-0096770 A | | 10/2007 |
| KR | 10-2007-0101127 A | | 10/2007 |
| KR | 10-2007-0101360 A | | 10/2007 |
| KR | 10-0771926 A | | 10/2007 |
| KR | 10-2008-0067042 A | | 7/2008 |

OTHER PUBLICATIONS

U.S. Appl. No. 13/185,793, filed Jul. 19, 2011, Inventor: Sang In Lee.
U.S. Appl. No. 13/273,076, filed Oct. 13, 2011, Inventor: Sang In Lee.
U.S. Appl. No. 13/285,417, filed Oct. 31, 2011, Inventor: Sang In Lee.
U.S. Appl. No. 13/295,012, filed Nov. 11, 2011, Inventor: Sang In Lee.
PCT Written Opinion, PCT Application No. PCT/KR2010/001076, Sep. 27, 2010, 8 pages.
PCT International Search Report and Written Opinion, PCT Application No. PCT/US2011/056285, Mar. 8, 2012, 11 pages.
PCT International Search Report and Written Opinion, PCT Application No. PCT/US11/58552, Mar. 14, 2012, 12 pages.
PCT International Search Report and Written Opinion, PCT Application No. PCT/US2011/060474, Mar. 22, 2012, 12 pages.
Dameron, A.A. et al., "Molecular Layer Deposition of Alucone Polymer Films Using Trimethylaluminum and Ethylene Glycol," Chem. Mater., 2008, pp. 3315-3326, vol. 20.
PCT Invitation to Pay Additional Fees, PCT Application No. PCT/US12/25095, May 22, 2012, 2 pages.
PCT International Search Report and Written Opinion, PCT Application No. PCT/US12/25483, May 29, 2012, 10 pages.
U.S. Appl. No. 13/369,717, filed Feb. 9, 2012, Inventor: Sang In Lee.
U.S. Appl. No. 13/397,590, filed Feb. 15, 2012, Inventor: Sang In Lee.

* cited by examiner

METHOD FOR FORMING THIN FILM USING RADICALS GENERATED BY PLASMA

CROSS-REFERENCE TO RELATED APPLICATION

This application claims priority from and the benefit under 35 U.S.C. §119(e) of U.S. patent application No. 61/154,664, filed on Feb. 23, 2009, which is incorporated by reference herein in its entirety.

BACKGROUND

1. Field of Art

Embodiments relate to forming a thin film using radicals generated by plasma.

2. Description of Art

Thin film deposition by means of plasma-enhanced chemical vapor deposition (PECVD) or plasma-enhanced atomic layer deposition (PEALD) results in lower deposition temperature due to plasma energy. However, the substrate may be damaged due to direct exposed to the plasma.

Remote plasma may be employed to avoid the issue of damaging the substrate. However, the extended distance between the substrate and plasma may give rise to the following issues: (i) reaction with a source precursor becomes insufficient for radicals having short lifespan, and (ii) the thickness and composition of the thin film become inconsistent because of poor plasma uniformity.

The source precursor may be decomposed when exposed to the plasma or radicals generated by the plasma. Therefore, when attempting PEALD, plasma of a reactant precursor (e.g., $O_2$, $H_2$, $NH_3$, $N_2$, and radicals thereof) has to be injected after the source precursor becomes adsorbed on the substrate.

A conventional process of PEALD may include the sequential steps in the following order: (i) adsorption of source precursor, (ii) purging, (iii) injection of reactant precursor plasma, and (iv) purging. In order to improve deposition rate, the process may be modified so that the steps are performed in the following order: (i) adsorption of source precursor, (ii) injection of reactant precursor plasma, and (iii) purging. However, since the adsorption of the source precursor determines the deposition rate of PEALD, improvement of the deposition rate is very limited.

SUMMARY

Embodiments provide a method for forming a thin film using radicals generated by plasma. The method includes injecting a source precursor between the formations of thin films by reaction of the radicals of reactant precursor with the source precursor.

In one embodiment, a thin film is formed by using radicals generated by plasma. The radicals of a reactant precursor are generated using plasma. A substrate is exposed to a mixture of the radicals of the reactant precursor and a source precursor to form a first thin film on the substrate. The substrate is exposed to the source precursor. A second thin film is formed on the substrate by exposing the substrate to the mixture of the radicals of the reactant precursor and the source precursor.

In another embodiment, a first electrode and a second electrode are provided. The first electrode includes one or more first injection ports. The second electrode encloses the first electrode and includes one or more second injection ports. The radicals of a reactant precursor are generated by injecting the reactant precursor through the one or more second injection ports and applying voltage across the first electrode and the second electrode. A source precursor is injected through the one or more first injection ports. A substrate is exposed to the radicals of the reactant precursor and the source precursor by moving the substrate relative to the first electrode and the second electrode.

BRIEF DESCRIPTION OF DRAWINGS

The above and other aspects, features and advantages of the disclosed embodiments will be more apparent from the following detailed description taken in conjunction with the accompanying drawings.

DETAILED DESCRIPTION

Figure 1:
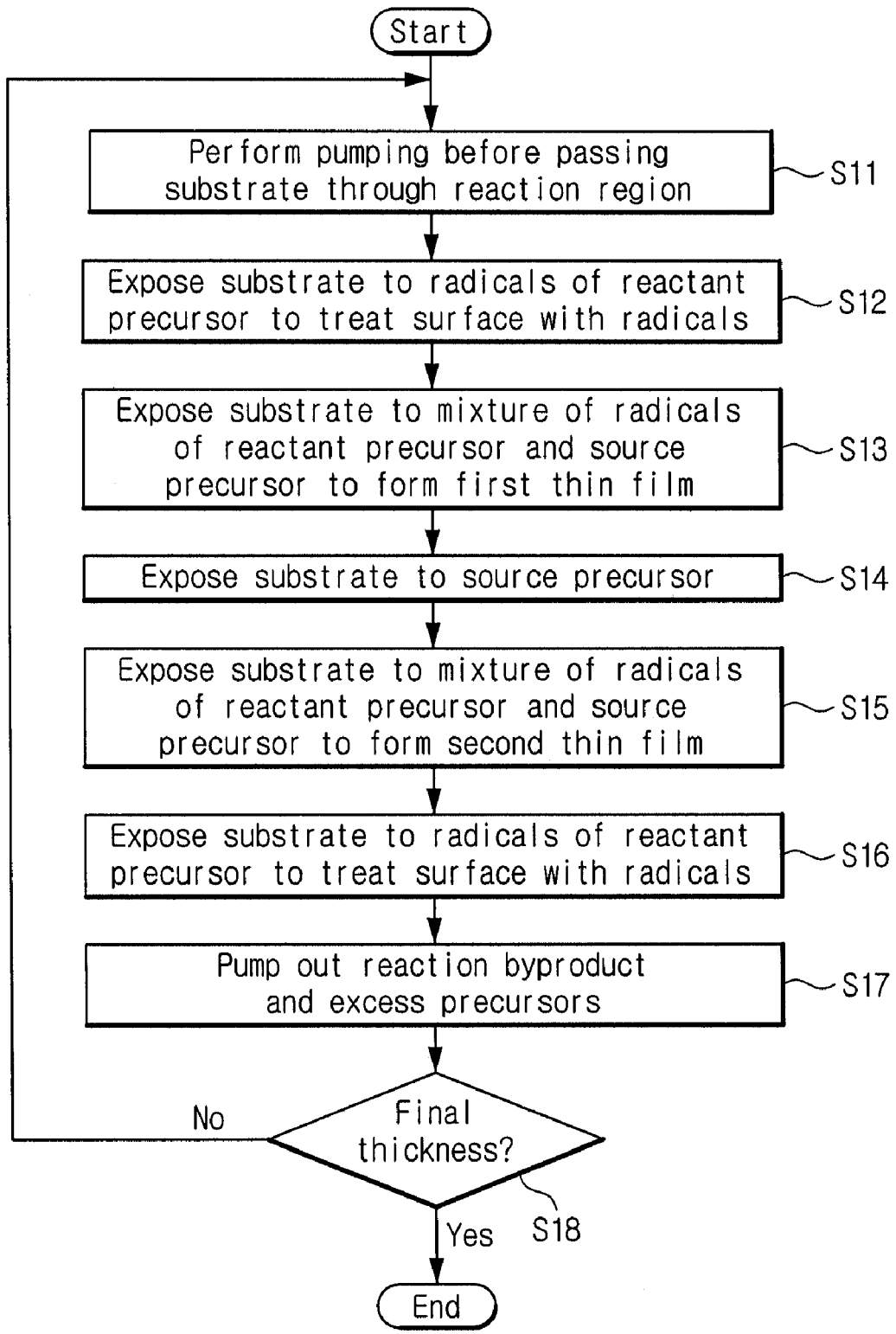
FIG. 1 shows a flow chart of a method for forming a thin film using radicals generated by plasma according to an embodiment.

Embodiments will be described more fully hereinafter with reference to the accompanying drawings, in which embodiments are shown. This disclosure may, however, be embodied in many different forms and should not be construed as limited to the embodiments set forth therein. Rather, these embodiments are provided so that this disclosure will be thorough and complete, and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced item. The use of the terms "first", "second", and the like does not imply any particular order, but they are included to identify individual elements. Moreover, the use of the terms first, second, etc. does not denote any order or importance, but rather the terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements. The shape, size and regions, and the like, of the drawing may be exaggerated for clarity.

Figure 2:
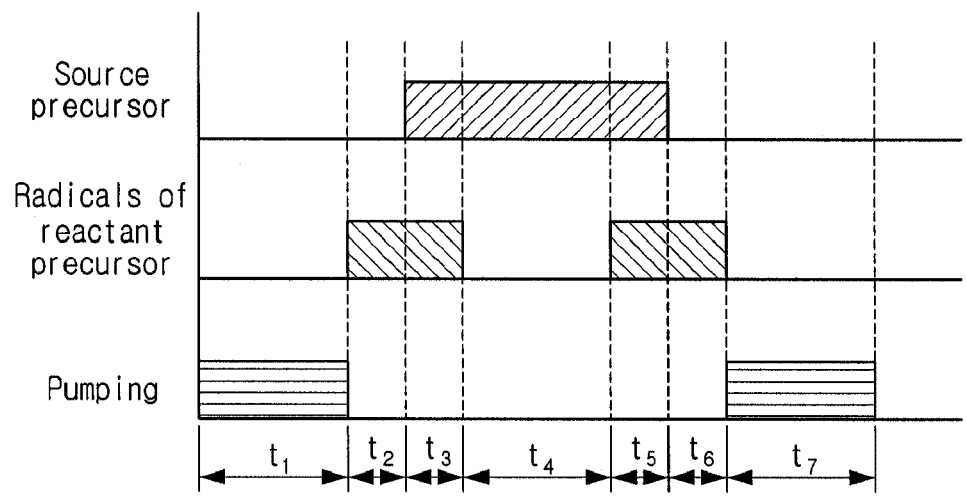
FIG. 2 shows a process flow diagram of a method for forming a thin film using radicals generated by plasma according to an embodiment.

FIG. 1 shows a flow chart of a method for forming a thin film using radicals generated by plasma according to an embodiment. FIG. 2 shows a process flow diagram of a method for forming a thin film using radicals generated by plasma according to an embodiment.

A method for forming a thin film using radicals generated by plasma according to an embodiment may be performed by moving a substrate relative to a vapor deposition reactor. For example, while the substrate passes through the vapor deposition reactor, the substrate may be exposed to a reactant precursor and/or a source precursor injected by the vapor deposition reactor.

Referring to FIG. 1 and FIG. 2, pumping may be performed before the substrate passes through the vapor deposition reactor (S11). The pumping process occurs during time $t_1$ in FIG. 2. The pumping is carried out to remove residues or impurities physically adsorbed on the substrate, which may have been produced in a preceding process. However, in other embodiments, the pumping process may be omitted.

Then, the substrate may be exposed to radicals of a reactant precursor to treat the surface of the substrate with the radicals (S12). The exposure to radicals occurs during time $t_2$ in FIG. 2. The radicals of the reactant precursor may be generated by remote plasma at a portion spaced apart from the substrate by a gap. The radicals of the reactant precursor may be adsorbed on the surface of the substrate.

Then, the substrate may be exposed to a mixture of the radicals of the reactant precursor and a source precursor (S13). The exposure to mixture of radicals occurs during time $t_3$ in FIG. 2. As the source precursor is adsorbed with the radicals of the reactant precursor already adsorbed on the substrate, the reactant precursor and the source precursor may react on the surface of the substrate to form a first thin film.

Then, the substrate may be exposed to the source precursor (S14). The exposure to the source precursor occurs during time $t_4$ in FIG. 2. As the source precursor is adsorbed again with the first thin film already formed on the substrate, the first thin film may be converted into a film with a relatively higher content of the source precursor.

Then, the substrate may be exposed again to the mixture of the radicals of the reactant precursor and the source precursor (S15). The exposure to the radicals of the reactance precursor occurs during time $t_5$ in FIG. 2. As in S13, the reactant precursor and the source precursor may react on the surface of the substrate to form a second thin film.

Then, the substrate may be exposed again to the radicals of the reactant precursor (S16). The exposure to the radicals of the reactance precursor occurs during time $t_6$ in FIG. 2. The radicals of the reactant precursor may form the thin film according to the above processes, and also stabilize the thin film by annealing the thin film by radicals.

Then, pumping may be performed again (S17). The pumping process occurs during time $t_7$ in FIG. 2. By pumping, excess precursors or reaction byproduct physically adsorbed on the substrate may be removed. However, in other embodiments, the pumping process may be omitted.

By repeating S11 through S17 until a thin film with a desired final thickness is obtained (S18), an atomic layer thin film with a desired thickness may be formed. As the substrate is exposed to the source precursor (S14) between the formation of the first thin film (S13) and the formation of the second thin film (S15), the rate of deposition may be improved.

FIGS. 3A to 3E show a vapor deposition reactor that may be used in a method for forming a thin film using radicals generated by plasma according to an embodiment. The method for forming a thin film using radicals generated by plasma will be described in detail with reference to FIGS. 3A to 3E.

Figure 3A:
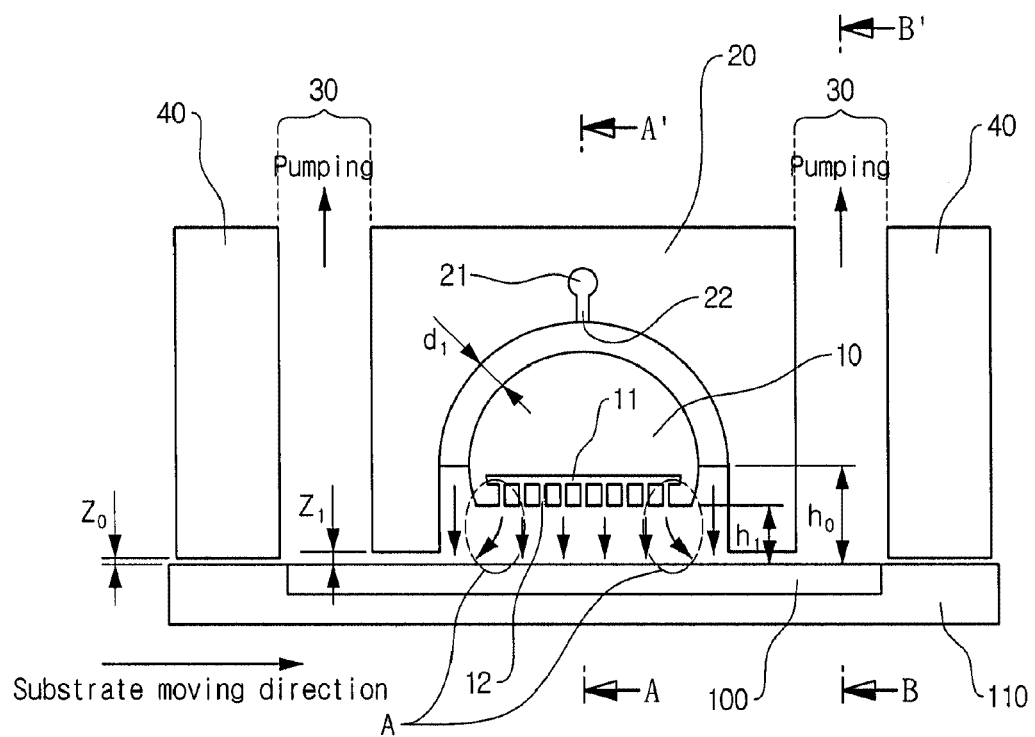
FIG. 3A shows a lateral cross-sectional view of a vapor deposition reactor for performing a method for forming a thin film using radicals generated by plasma according to an embodiment.
Figure 3B:
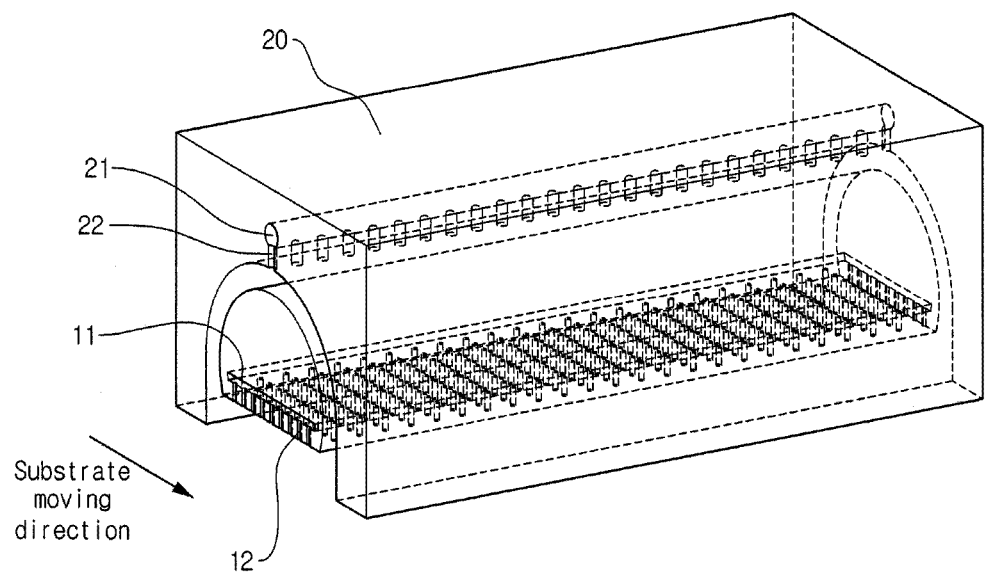
FIG. 3B shows a partial perspective view of the vapor deposition reactor of FIG. 3A.
Figure 3C:
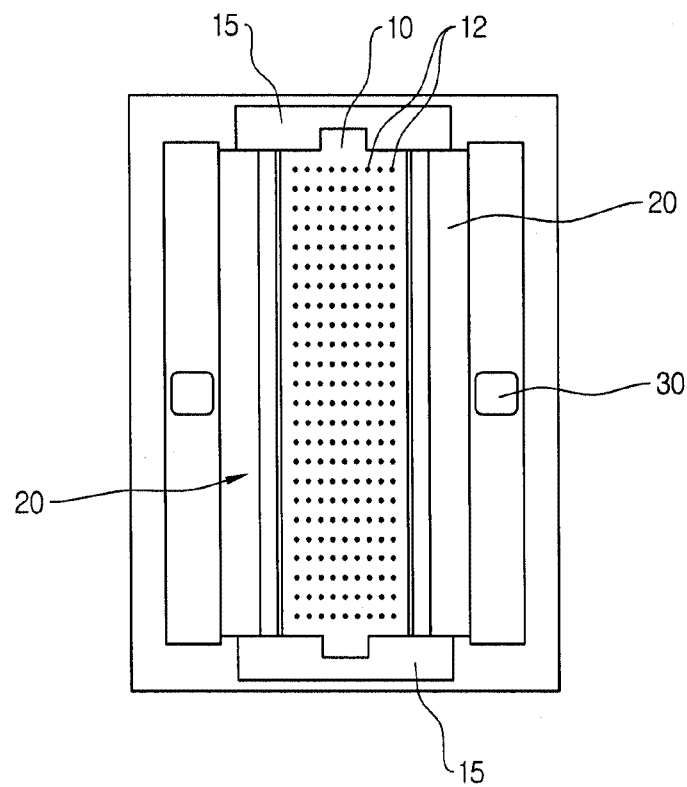
FIG. 3C shows a bottom view of the vapor deposition reactor of FIG. 3A.
Figure 3D:
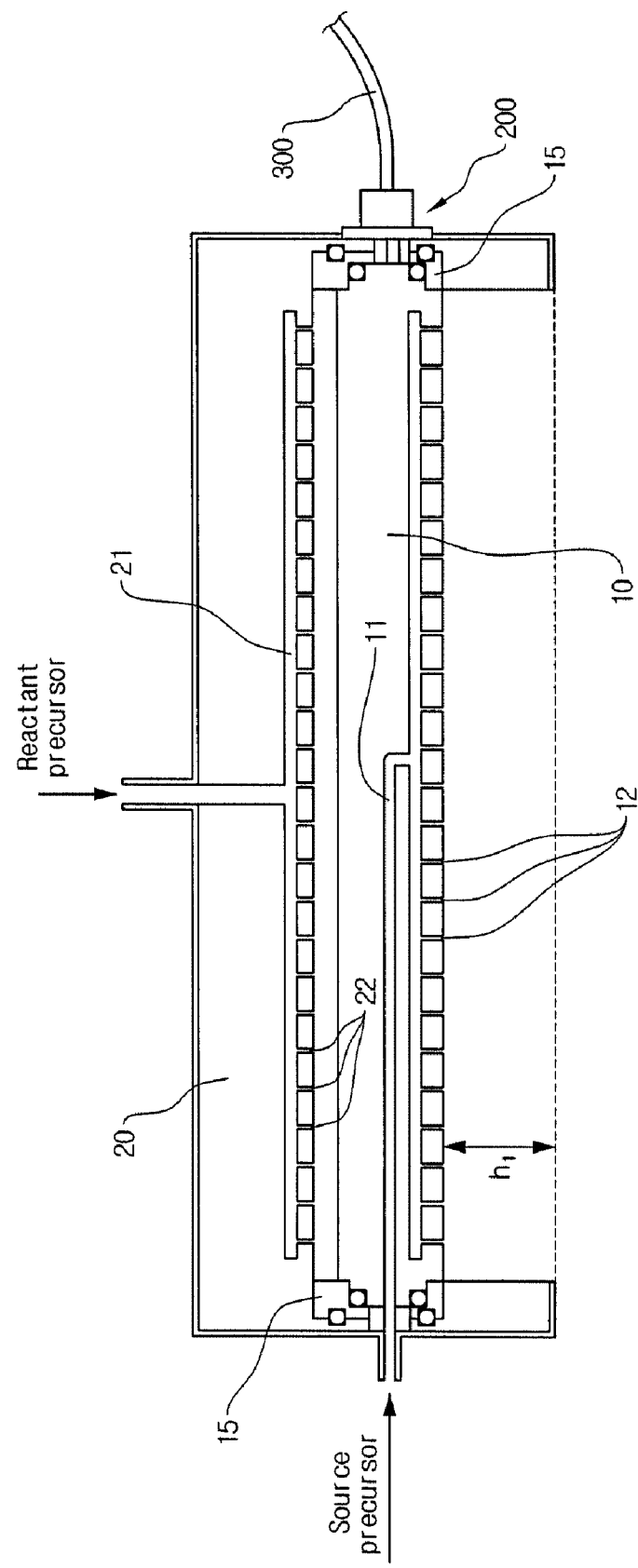
FIG. 3D shows a longitudinal cross-sectional view taken along line A-A' in FIG. 3A.

FIG. 3A shows a lateral cross-sectional view of a vapor deposition reactor for performing a method for forming a thin film using radicals generated by plasma according to an embodiment. FIG. 3B shows a partial perspective view of a first electrode 10 and a second electrode 20 of the vapor deposition reactor of FIG. 3A. FIG. 3C shows a bottom view of the vapor deposition reactor of FIG. 3A. FIG. 3D shows a longitudinal cross-sectional view of the vapor deposition reactor taken along line A-A' in FIG. 3A.

Referring to FIGS. 3A to 3D, a vapor deposition reactor may include a first electrode 10 and a second electrode 20. The first electrode 10 may be provided, at least in part, inside of the second electrode 20, and the second electrode 20 may, at least in part, enclose the first electrode 10.

The first electrode 10 and the second electrode 20 may be electrically separated from each other. For example, the first electrode 10 and the second electrode 20 may be spaced apart from each other by a gap $d_1$. In case the first electrode 10 and the second electrode 20 need to be in contact at some portion, an insulator 15 (FIG. 3C) made of ceramic (e.g., $Al_2O_3$) may be provided between the first electrode 10 and the second electrode 20 to insulate the first electrode 10 and the second electrode 20 from each other.

The first electrode 10 and the second electrode 20 may be made of a suitable conducting material such as metal. In case of dielectric barrier discharge plasma, a dielectric barrier may be inserted or coated between the two electrodes. For example, the first electrode 10 and the second electrode 20 may be made of stainless steel, Inconel, nickel (Ni), aluminum (Al), high fusion point metal, conductive silicon (Si) doped with a dopant, anodized aluminum, metal or conductive silicon coated with a dielectric (e.g., $SiO_2$, $Al_2O_3$ or SiN), or the like.

When there is a risk of inclusion of the material of the first electrode 10 or the second electrode 20 into the thin film, the first electrode 10 or the second electrode 20 may be made of the same material as the thin film. For example, if a NiO thin film is to be formed, the first electrode 10 or the second electrode 20 may be made of Ni or Ni alloy. Further, if a $SiO_2$ or SiN thin film is to be formed, the first electrode 10 or the second electrode 20 may be made of silicon. The silicon may be doped with boron (B) or phosphorus (P) to confer conductivity.

The vapor deposition reactor comprising the first electrode 10 and the second electrode 20 may be configured such that a substrate 100 may move relative thereto so that a material may be injected to the substrate 100. For example, the substrate 100 may pass below the first electrode 10 and the second electrode 20 as fixed on a susceptor 110. The motion of the substrate 100 relative to the first electrode 10 and the second electrode 20 may be linear motion, rotational motion or other appropriate motions. Alternatively, instead of moving the substrate 100, the first electrode 10 and the second electrode 20 may be moved relative to the substrate 100 so as to inject a material to the substrate 100.

The first electrode 10 may include a channel 11 and one or more injection port(s) 12 connected to the channel 11. The channel 11 is formed inside the first electrode 10 and transports a material injected from outside. The one or more injection port(s) 12 is connected to the channel 11 and may be formed on the surface of the first electrode 10. The injection port 12 discharges the material transported through the channel 11 from the first electrode 10 to inject the material to the substrate 100. For example, the channel 11 and the one or more injection port(s) 12 may be formed at the lower end of the first electrode 10 in the form of a showerhead.

The material injected through the channel 11 and the injection port 12 of the first electrode 10 may be a source precursor for chemical vapor deposition (CVD) or atomic layer deposition (ALD). For example, if it is desirable to form a thin film comprising titanium nitride (TiN) on the substrate 100, titanium tetrachloride ($TiCl_4$) may be injected through the injection port 12 as a source precursor. The source precursor may be supplied by means of bubbling argon (Ar).

The second electrode 20 may also comprise a channel 21 and one or more injection port(s) 22 connected to the channel 21. The material injected through the channel 21 and the injection port 22 of the second electrode 20 may be a reactant precursor. For example, if it is desirable to form a thin film comprising TiN on the substrate 100, ammonia ($NH_3$) may be injected through the injection port 22 as a reactant precursor.

Voltage may be applied across the first electrode 10 and the second electrode 20. For example, the first electrode 10 and the second electrode 20 may be connected to a power cable 300 (see FIG. 3D) by means of a connector 200 (see FIG. 3D) so as to apply voltage across the first electrode 10 and the second electrode 20. The voltage is applied to generate plasma from the reactant precursor injected between the first electrode 10 and the second electrode 20 to generate radicals of the reactant precursor. A pulse or RF type voltage signal may be applied between the first electrode 10 and the second electrode 20 to generate the radicals of the reactant precursor.

The surface of the second electrode 20 facing the first electrode 10 may have a shape corresponding, at least in part, to the surface shape of the first electrode 10. For example, if the first electrode 10 has a cylindrical shape, the cross-section of the second electrode 20 perpendicular to the longitudinal direction of the first electrode 10 may have, at least in part, a shape concentric with the cylindrical cross-section of the first electrode 10. Accordingly, plasma may be generated uniformly between the first electrode 10 and the second electrode 20. However, this is merely illustrative. In other embodiments, the first electrode 10 and the second electrode 20 may have different cross-sectional shapes.

The portion where the first electrode 10 and the second electrode 20 face each other, i.e., the portion where the plasma of the reactant precursor is generated, may be spaced apart from the substrate 100 by a gap $h_0$ so as to prevent the substrate 100 from being damaged by the plasma. In one embodiment, the gap $h_0$ may be about 10 mm or larger. Further, the lower end of the first electrode 10 may be spaced apart from the substrate 100 by a gap $h_1$. For example, the gap $h_1$ may be about 3 mm to about 20 mm. The lower end of the second electrode 20 may be spaced apart from the substrate 100 by gap $z_1$, which may be about 1 mm be about 5 mm. Alternatively, the gap $z_0$ between an outer wall 40 of the vapor deposition reactor and the substrate 100 may be smaller than the gap $z_1$, and the gap $z_0$ may be about 1 mm in order to decrease leakage of the source precursor and the reactant precursor from the vapor deposition reactor.

The vapor deposition reactor may comprise a discharge port 30 on one side or both sides of the second electrode 20. The discharge port 30 is provided to discharge impurities or remaining precursors physically adsorbed on the substrate 100. Pumping is achieved when the pressure inside the discharge port 30 is smaller than the pressure of the portion adjacent to the first electrode 10 and the second electrode 20. For this purpose, a throttle valve (not shown) may be provided to maintain the pressure inside the discharge port 30 at about 10 mTorr to about several Torr.

Figure 3E:
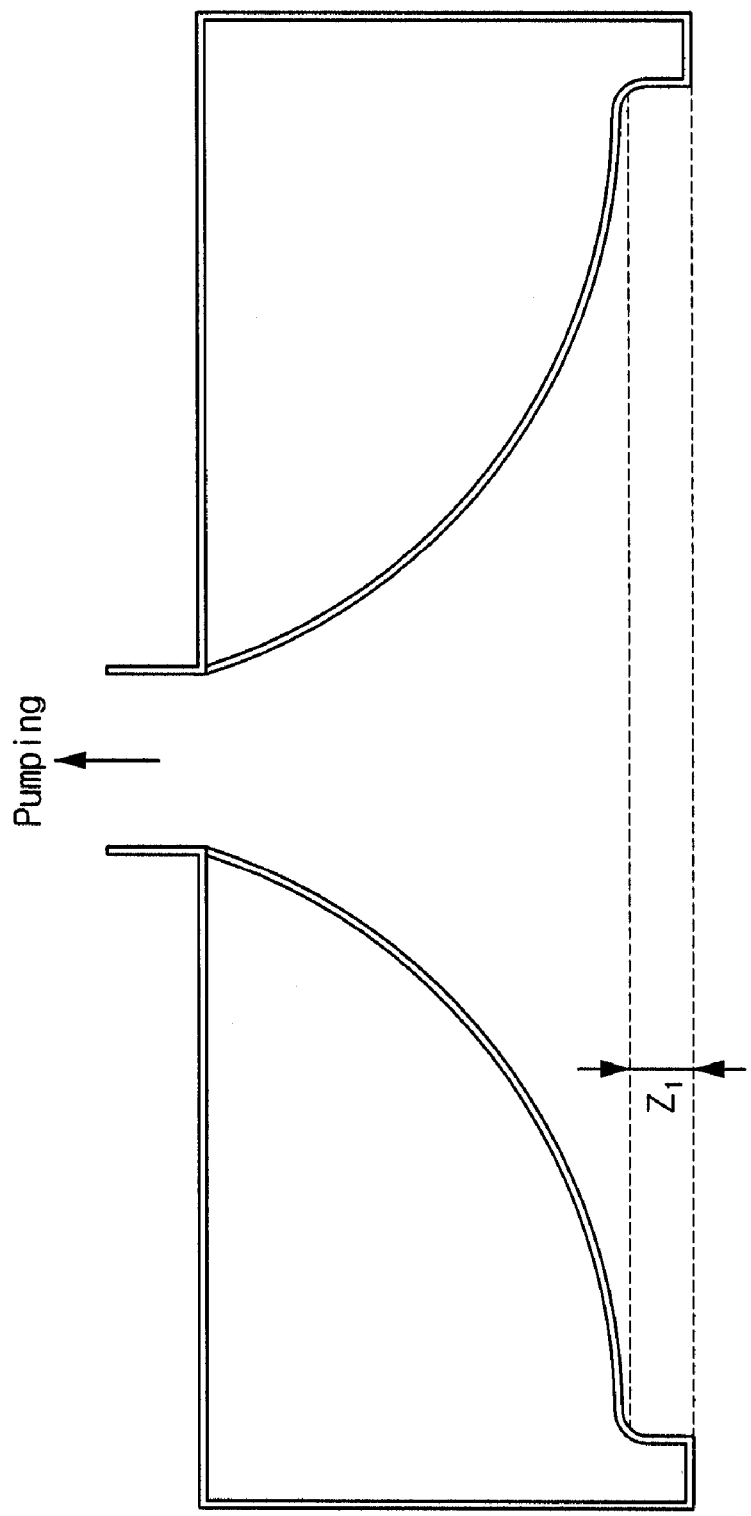
FIG. 3E shows a longitudinal cross-sectional view taken along line B-B' in FIG. 3A.

FIG. 3E shows a longitudinal cross-sectional view of the vapor deposition reactor along line B-B' in FIG. 3A, where the discharge port 30 is provided. Referring to FIG. 3E, the surface of the discharge port 30 may be curved to confer high conductance. In this embodiment, the discharge port 30 is provided on both sides of the vapor deposition reactor. However, this is merely illustrative. In other embodiments, the discharge port 30 may be provided on one side of the vapor deposition reactor, or may not be provided at all.

Hereinafter, a method for forming a thin film using radicals generated by plasma on the substrate 100 using the aforedescribed vapor deposition reactor will be described in detail. First, $NH_3$ may be injected at about 1 sccm to about 10 sccm as a reactant precursor between the first electrode 10 and the second electrode 20 that is concentric with the first electrode 10. The reactant precursor may be injected between the first electrode 10 and the second electrode 20 through the channel 21 and the one or more injection port(s) 22 formed on the second electrode 20. Then, pulse voltage signal of about 1 kHz to about 100 kHz may be applied between the first electrode 10 and the second electrode 20 to generate plasma. Then, TiCl$_4$ may be injected at about 1 sccm to about 10 sccm as a source precursor through the first channel 11 and the one or more injection port(s) 12 formed on the first electrode 10.

The substrate 100 may move from the left side of the vapor deposition reactor to below the discharge port 30. The discharge port 30 may remove impurities or residues physically adsorbed on the substrate 100 by means of pumping. The impurities or residues may have been produced from the preceding process. However, in other embodiments, the substrate 100 may be directly passed below the first electrode 10 and the second electrode 20 without the pumping.

As the substrate 100 moves to the right and is located below the second electrode 20, the substrate 100 may be exposed to the radicals of the reactant precursor generated by the plasma. For example, as the substrate 100 passes below the second electrode 20, N* radicals generated at a portion spaced apart with a gap h$_0$ of about 10 mm or larger from the substrate 100 may be adsorbed on the surface of the substrate 100.

As the substrate 100 moves further to the right and passes below the first electrode 10, the substrate 100 passes through a region A where some of the radicals of the reactant precursor react with the source precursor. The gap d$_1$ between the first electrode 10 and the second electrode 20 may be relatively large (e.g., about 3 mm or larger), and the gap h$_0$ between the portion where the plasma is generated and the substrate 100 may be relatively small (e.g., about 2 mm or larger). In this case, the edge portion A of the radicals of the reactant precursor that are generated by the plasma and injected to the substrate 100, may contact and/or react with the source precursor injected through the injection port 12.

On the contrary, in other embodiments, the gap d$_1$ between the first electrode 10 and the second electrode 20 may be relatively small, and the gap h$_0$ between the portion where the plasma is generated and the substrate 100 may be relatively large. In this configuration, the reaction area of the radicals is enlarged and the effect of the radicals may be increased. This will be described later in detail.

As the substrate 100 passes through the region A, a first thin film including TiN may be formed on the surface of the substrate 100. The first thin film may include N-rich TiN.

Then, as the substrate 100 moves further and is located below the injection port 12 that is provided at the center of the first electrode 10, the source precursor TiCl$_4$ may be adsorbed on the surface of the substrate 100. Then, the surface of the first thin film comprising N-rich TiN may be converted to Ti-rich TiN as the first thin film is exposed to TiCl$_4$.

Then, as the substrate 100 moves further to the right, the substrate 100 passes again through the region A where the radicals of the reactant precursor react with the source precursor. Then, as in the above-described formation of the first thin film, a second thin film comprising N-rich TiN may be formed.

As the substrate 100 moves further to the right and passes below the first electrode 10, the substrate 100 may be exposed to N* radicals injected through the injection port 22 of the second electrode 20. Then, a relatively stable TiN film may be obtained as the first thin film and the second thin film are annealed by the N* radicals.

Then, as the substrate 100 moves further to the right and passes below the second electrode 20, the substrate 100 is located below the discharge port 30 and excess source precursor or reactant precursor and reaction byproduct may be removed by means of pumping.

The deposition rate of the thin film during the aforesaid thin film formation may be determined, at least in part, by the flow rate of the reactant precursor and the source precursor, the power of the plasma, the gap d$_1$ between the first electrode 10 and the second electrode 20, the gap h$_0$ between the region where the plasma is generated and the substrate 100, the moving speed of the substrate 100, the temperature of the substrate 100, the injection time of the source precursor to the substrate 100, or other related parameters.

For example, the temperature of the substrate 100 may be about 150° C. to about 350° C., and the moving speed of the substrate 100 may be controlled such that the time during which the substrate 100 is exposed to the radicals of the reactant precursor or the source precursor may be about 10 milliseconds to about several seconds. If the temperature of the substrate 100 is higher than the decomposition temperature of the source precursor, decomposition of the source precursor may occur. Thus, the reactor may be cooled using cooling water or its temperature may be controlled, if necessary. Further, the flow rate may be controlled such that the source precursor injected through the injection port 12 and the reactant precursor injected through the injection port 22 has substantially the same pressure. For example, the source precursor and the reactant precursor may be maintained at a pressure of about 100 mTorr to about several Torr.

Figure 4:
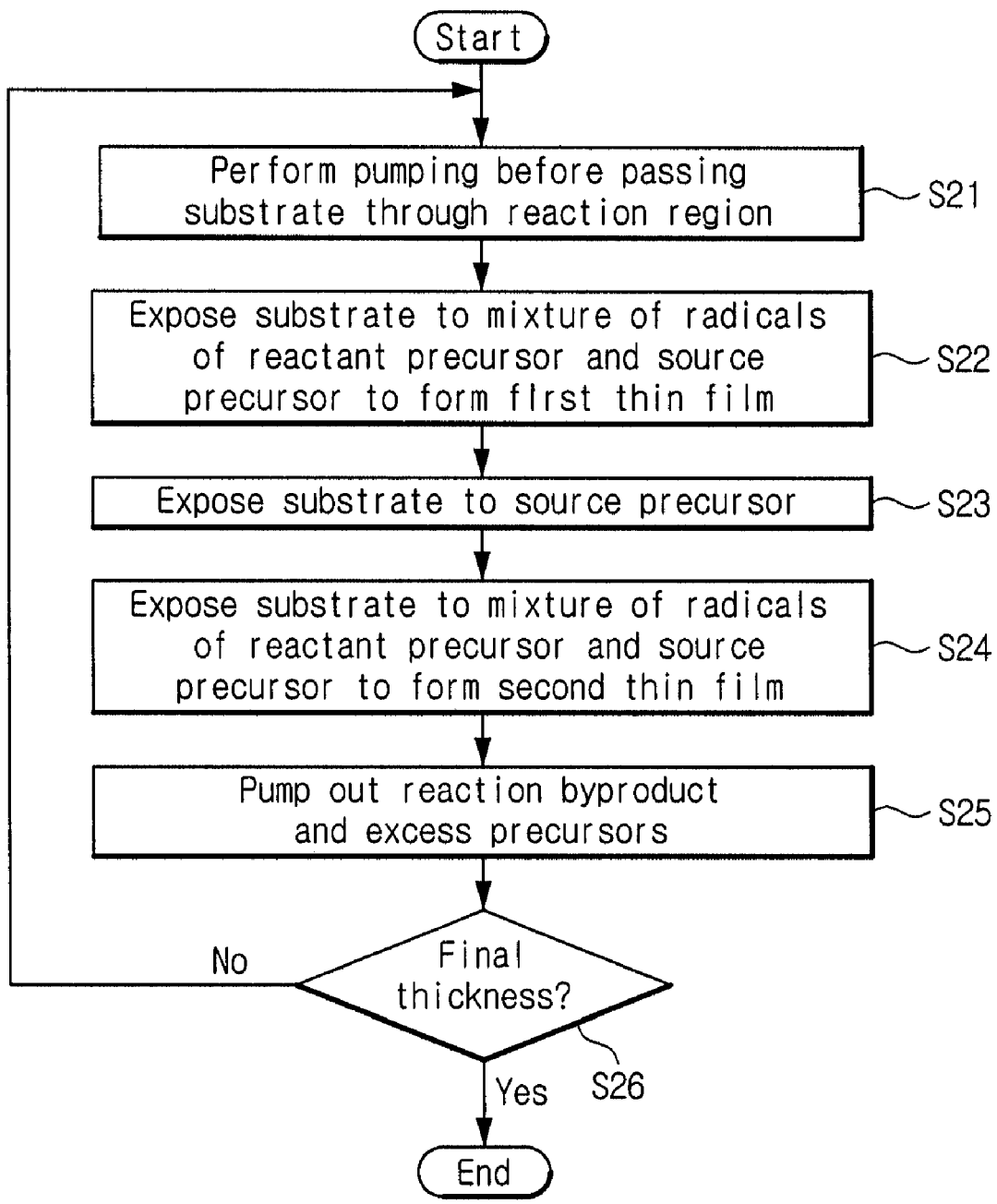
FIG. 4 shows a flow chart of a method for forming a thin film using radicals generated by plasma according to another embodiment.
Figure 5:
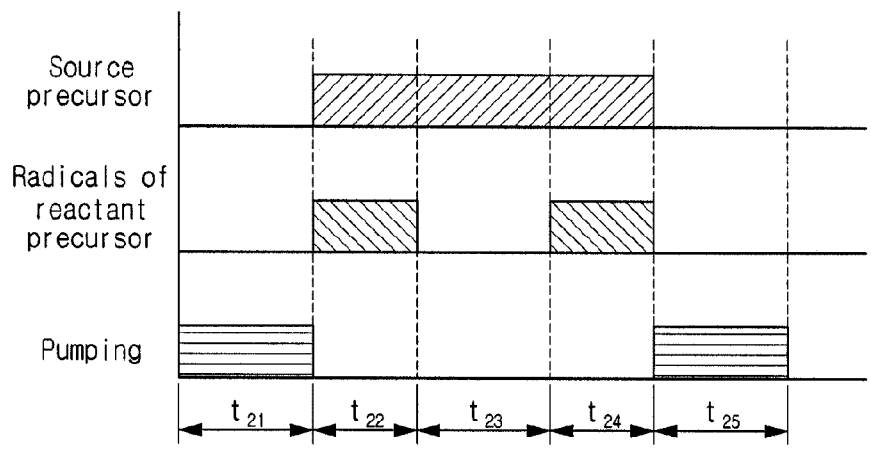
FIG. 5 shows a process flow diagram of a method for forming a thin film using radicals generated by plasma according to another embodiment.

FIG. 4 shows a flow chart of a method for forming a thin film using radicals generated by plasma according to another embodiment. FIG. 5 shows a process flow diagram of a method for forming a thin film using radicals generated by plasma according to another embodiment. Referring to FIG. 4 and FIG. 5, pumping may be performed before the substrate passes through the vapor deposition reactor (S21). The pumping process occurs during time t$_{21}$ in FIG. 5. The pumping is carried out to pump out residues or impurities physically adsorbed on the substrate that may have been produced from the preceding process. However, in other embodiments, the pumping process may be omitted.

Then, the substrate may be exposed to a mixture of radicals of a reactant precursor and a source precursor (S22). The exposure to the mixture of radicals occurs during time t$_{22}$ in FIG. 5. Contrary to the above embodiment described above with reference to FIGS. 1 to 3, the reactant precursor of this embodiment is configured such that all of the radicals contact and/or react with the source precursor. This is applicable when the flow rate of the source precursor is relatively low, and may be achieved by increasing the distance between the substrate and the portion where the plasma is generated. This will be described in more detail later with reference to FIG. 6. As a result, a first thin film may be formed on the substrate as the radicals of the reactant precursor react with the source precursor.

Then, the substrate may be exposed to the source precursor (S23). The exposure to the source precursor occurs during time t$_{23}$ in FIG. 5. As the source precursor is adsorbed again with the first thin film already formed on the substrate, the first thin film may be converted into a film with a relatively higher source precursor content.

Then, the substrate may be exposed again to the mixture of the radicals of the reactant precursor and the source precursor (S24). The exposure to the mixture occurs during time t$_{24}$ in FIG. 5. As in S22, all of the radicals of the reactant precursor and the source precursor may contact and/or react on the surface of the substrate so as to form a second thin film.

Then, pumping may be performed again (S25). The pumping process occurs during time t$_{25}$ in FIG. 5. By pumping, excess precursors or reaction byproduct physically adsorbed on the substrate may be removed. However, in other embodiments, the pumping process may be omitted.

By repeating S21 through S25 until a thin film with a desired final thickness is obtained (S26), an atomic layer thin film with desired thickness may be formed. As the substrate is exposed to the source precursor (S23) between the formation of the first thin film (S22) and the formation of the second thin film (S24), the rate of deposition may be improved.

Figure 6A:
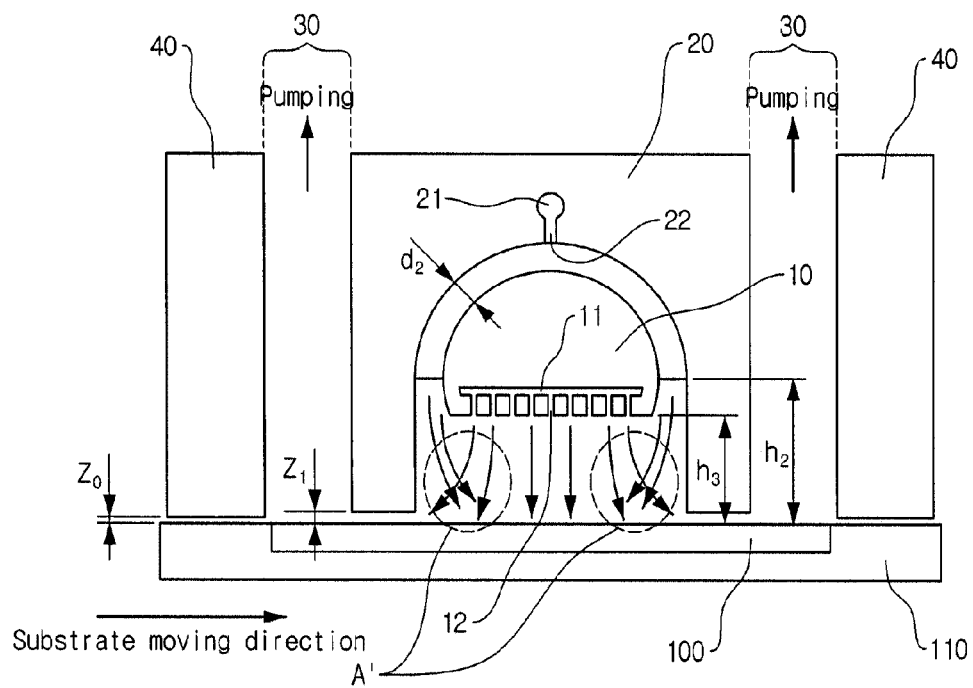
FIG. 6A shows a lateral cross-sectional view of a vapor deposition reactor for performing a method for forming a thin film using radicals generated by plasma according to another embodiment.

FIG. 6A shows a lateral cross-sectional view of a vapor deposition reactor for performing a method for forming a thin film using radicals generated by plasma according to another embodiment.

In the description of the method for forming a thin film using radicals generated by plasma with reference to the vapor deposition reactor of FIG. 6A, description about the aspect that may be easily understood by those skilled in the art from the description given referring to FIGS. 1 to 3 will be omitted.

Referring to FIG. 6A, a gap $d_2$ between the first electrode 10 and the second electrode 20 may be relatively small, and a gap $h_2$ between the portion where plasma is generated and the substrate 100 may be relatively large. In this case, all of the radicals of the reactant precursor generated by the plasma and injected through the injection port 22, may contact and/or react with the source precursor injected through the injection port 12.

For example, the gap $d_2$ between the first electrode 10 and the second electrode 20 may be about 2 mm or larger. The gap $h_2$ between the portion where plasma is generated and the substrate 100 may be about 5 mm or larger. The gap $h_2$ between the portion where plasma is generated and the substrate 100 may also be about 20 mm. And, a gap $h_3$ between the lower end of the first electrode 10 and the substrate 100 may be about 3 mm to about 30 mm. Herein, the leakage of the precursors from the vapor deposition reactor will be decreased as the gap $h_3$ is decreased, i.e., as the lower end of the first electrode 10 approaches the substrate 100.

Figure 6B:
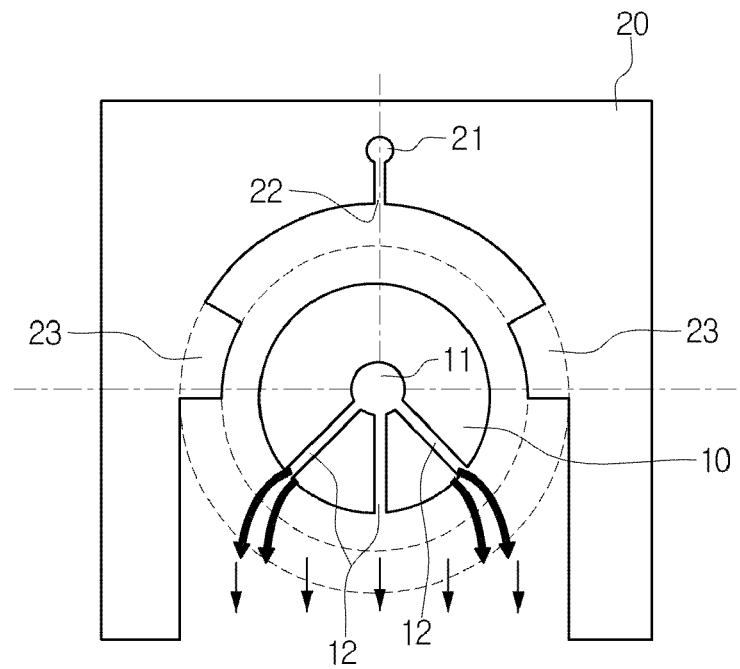
FIGS. 6B and 6C show a lateral cross-sectional view of first and second electrodes in a vapor deposition reactor for performing a method for forming a thin film using radicals generated by plasma according to other embodiments.
Figure 6C:
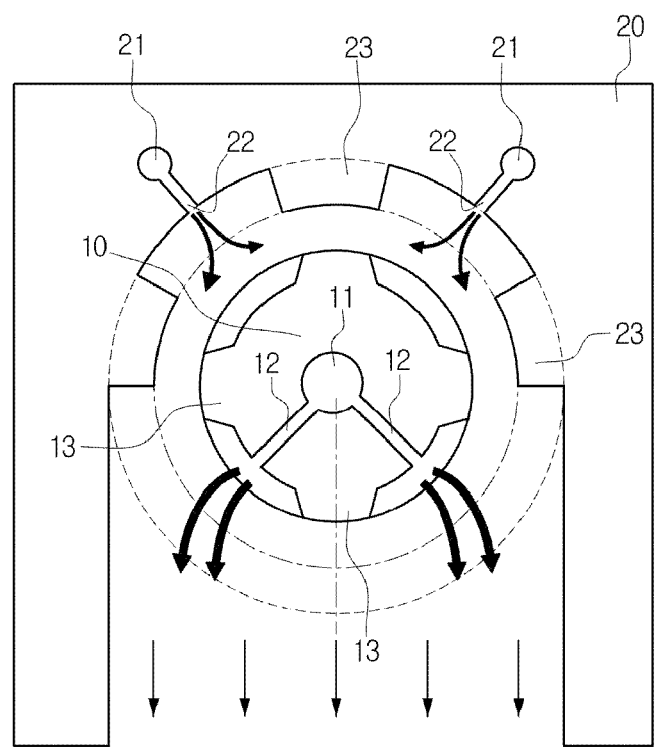

FIGS. 6B and 6C shows a lateral cross-sectional view of first and second electrodes in a vapor deposition reactor for performing a method for forming a thin film using radicals generated by plasma according to other embodiments.

The first and second electrodes of the vapor deposition reactor shown in FIGS. 6B and 6C may be operated in a manner similar to the vapor deposition reactor of FIG. 6A. In the vapor deposition reactor in FIG. 6B, the first electrode 10, which is an inner element for generating plasma, may have a shape concentric with the second electrode 20. The precursors may be supplied through the channel 11 and the injection port(s) 12 of the first electrode 10 and the channel 21 and the injection port(s) 22 of the second electrode 20. The second electrode 20 includes projecting portion(s) 23 and the plasma is generated in an area where the projecting portion(s) 23 and the first electrode 10 face each other.

Figure 6D:
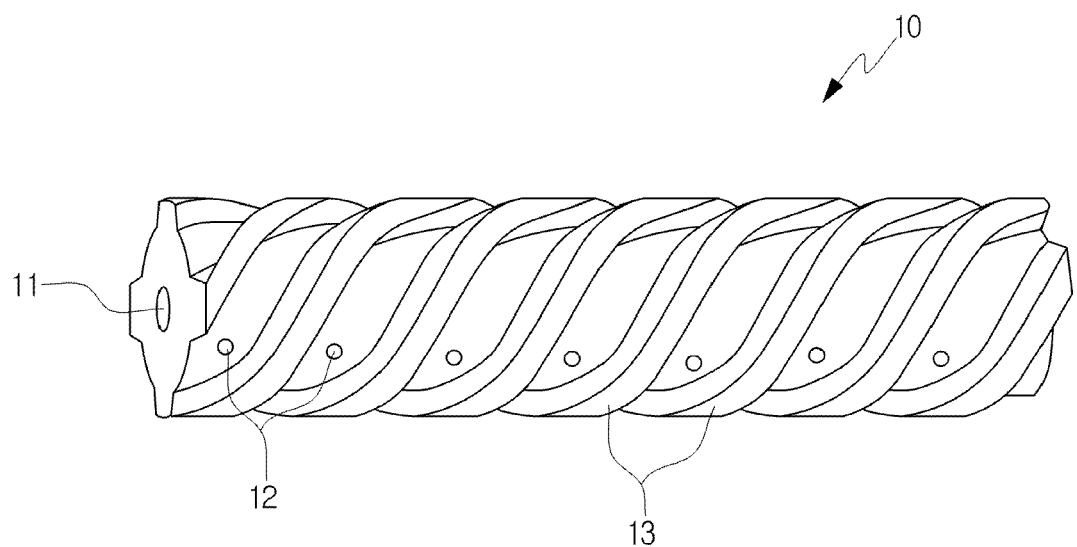
FIG. 6D shows a perspective view illustrating the structure of the first electrode in FIG. 6C.

In the vapor deposition reactor in FIG. 6C, the first electrode 10 has a structure having the shape of a helical gear so as to increase the area where the plasma is generated. The structure of this first electrode 10 is shown in FIG. 6D. As shown in FIGS. 6C and 6D, the fist electrode 10 may include projecting portion(s) 13 which is protruded from the first electrode 10 in a helical shape along the longitudinal direction of the first electrode 10. Further, the second electrode 20 may include projecting portion(s) 23. Since the plasma is generated in an area where the projecting portion(s) 23 and the projecting portion(s) 13 face each other, the area where the plasma is generated is increased.

The structures of the first electrode 10 and second electrode 20 shown in FIGS. 6B through 6D may be applied not only to the vapor deposition reactor in FIG. 6A, but also to other vapor deposition reactors for performing a method for forming a thin film using radicals generated by plasma.

Hereinafter, a method for forming a thin film using radicals generated by plasma on the substrate 100 using the aforesaid described vapor deposition reactor will be described in detail.

The substrate 100 may move from the left side of the vapor deposition reactor and be located below the discharge port 30. The discharge port 30 may remove impurities or residues physically adsorbed on the substrate 100 by means of pumping. The impurities or residues may have been produced from the preceding process. However, in other embodiments, the substrate 100 may be directly passed below the first electrode 10 and the second electrode 20 without the pumping.

As the substrate 100 moves further to the right and is located below the second electrode 20, the substrate 100 passes through a region A' where the radicals of the reactant precursor contact and/or react with the source precursor. As the substrate 100 passes through the region A', a first thin film comprising TiN may be formed on the surface of the substrate 100 from the reaction of the reactant precursor and the source precursor. The first thin film may include N-rich TiN.

Then, as the substrate 100 moves further and is located below the injection port 12 provided at the center of the first electrode 10, the source precursor $TiCl_4$ may be adsorbed on the surface of the substrate 100. Then, the surface of the first thin film comprising N-rich TiN may be converted to Ti-rich TiN as the first thin film is exposed to $TiCl_4$.

Then, as the substrate 100 moves further to the right, the substrate 100 passes again through the region A' where the radicals of the reactant precursor react with the source precursor. Then, as in the above-described formation of the first thin film, a second thin film comprising N-rich TiN may be formed. Since the TiN thin film is formed while N* radicals are supplied on the surface of the substrate 100 on which $TiCl_4$ is adsorbed, a relatively stable TiN thin film may be formed.

Then, as the substrate 100 moves further rightward and passes past below the second electrode 20, the substrate 100 is located below the discharge port 30 and excessively injected source precursor or reactant precursor and reaction byproduct may be removed by means of pumping.

In the embodiment described referring to FIGS. 4 to 6, the consumption of the source precursor may be reduced compared to the previous embodiment described above with reference to FIGS. 1 to 3. That is to say, the embodiment described referring to FIGS. 4 to 6 is applicable when the pressure inside the vapor deposition reactor is relatively low and/or when the flow rate of the source precursor is low.

In the embodiments described above, $TiCl_4$ is used as the source precursor and $NH_3$ is used as the reactant precursor, and N* radicals generated from the reactant precursor by a remote plasma are used to form TiN thin film. However, this is merely illustrative. The source precursor, the reactant precursor and/or the resultant thin film may be different from those described in the above embodiments.

For example, a thin film comprising pure titanium (Ti) may be formed by using $TiCl_4$ as the source precursor and using hydrogen ($H_2$) as the reactant precursor, and using H* radicals generated from the reactant precursor by a remote plasma. In this case, the temperature of the substrate 100 may be about 150° C. to about 500° C. Also, in an embodiment, a mixture of $TiCl_4$ and silicon hydride ($SiH_4$) or a hydrogen compound may be used as the source precursor in order to decrease resistance of the thin film and reduce residual Cl. For example, $1H_4$ or $B_2H_6$ may be added to the $TiCl_4$ source precursor at about 1 sccm to about 10 sccm.

In still another embodiment, two vapor deposition reactors may be provided in sequence to improve the rate of thin film deposition.

Figure 7A:
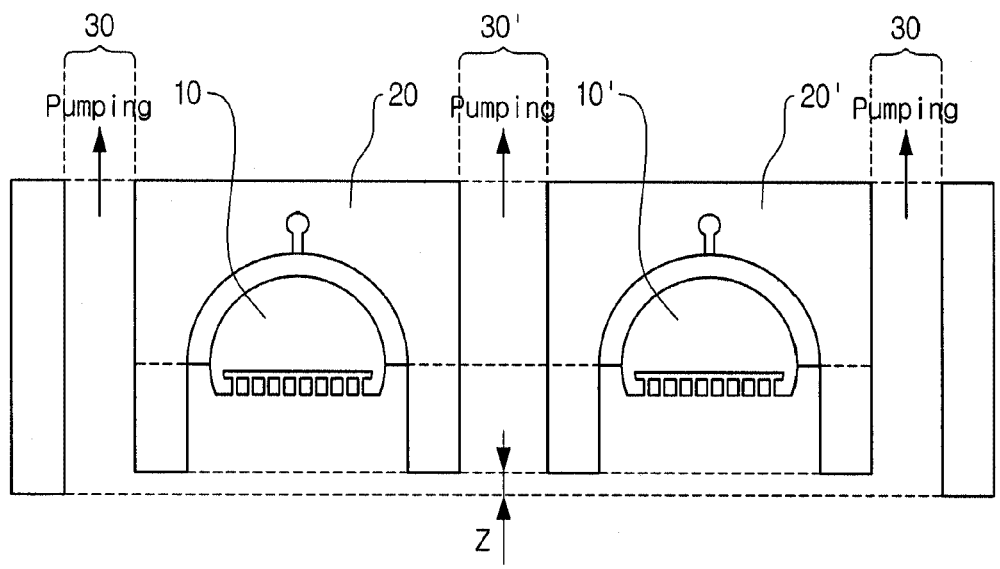
FIG. 7A shows a lateral cross-sectional view of a vapor deposition reactor for performing a method for forming a thin film using radicals generated by plasma according to still another embodiment.
Figure 7B:
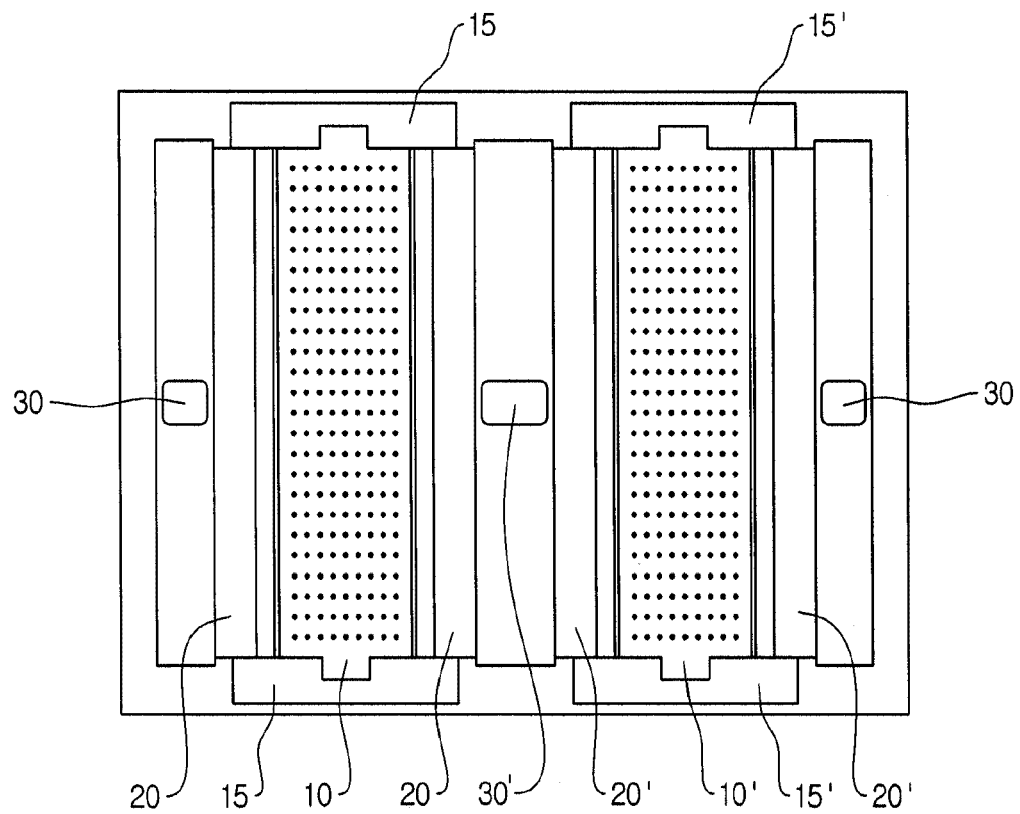
FIG. 7B shows a bottom view of the vapor deposition reactor of FIG. 7A.

FIG. 7A shows a lateral cross-sectional view of a vapor deposition reactor for performing a method for forming a thin film using radicals generated by plasma according to still another embodiment. FIG. 7B shows a bottom view of the vapor deposition reactor of FIG. 7A. Referring to FIGS. 7A and 7B, adjacent to a vapor deposition reactor including a first electrode 10 and a second electrode 20, another vapor deposition reactor including a first electrode 10' and a second electrode 20' may be provided. Between the second electrodes 20, 20', a discharge port 30' may be provided. Also, discharge ports 30 may be provided outside of the two second electrodes 20, 20'. The discharge port 30' between the second electrodes 20, 20' may be larger in size than the other discharge ports 30, but this is merely illustrative. For example, the discharge port 30' may be about 150% to about 200% in size based on the discharge port 30.

Figure 8A:
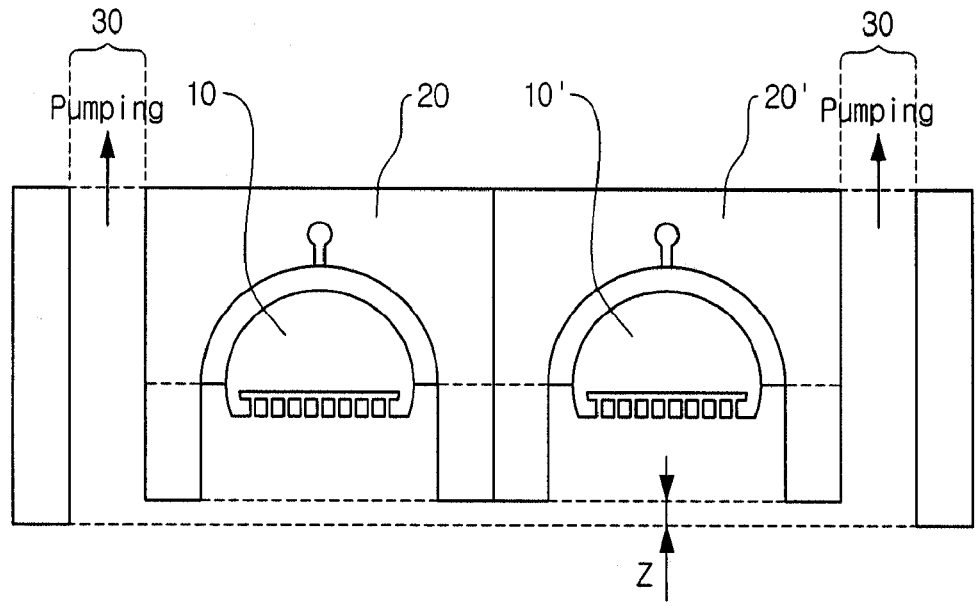
FIG. 8A shows a lateral cross-sectional view of another vapor deposition reactor for performing a method for forming a thin film using radicals generated by plasma according to still another embodiment.
Figure 8B:
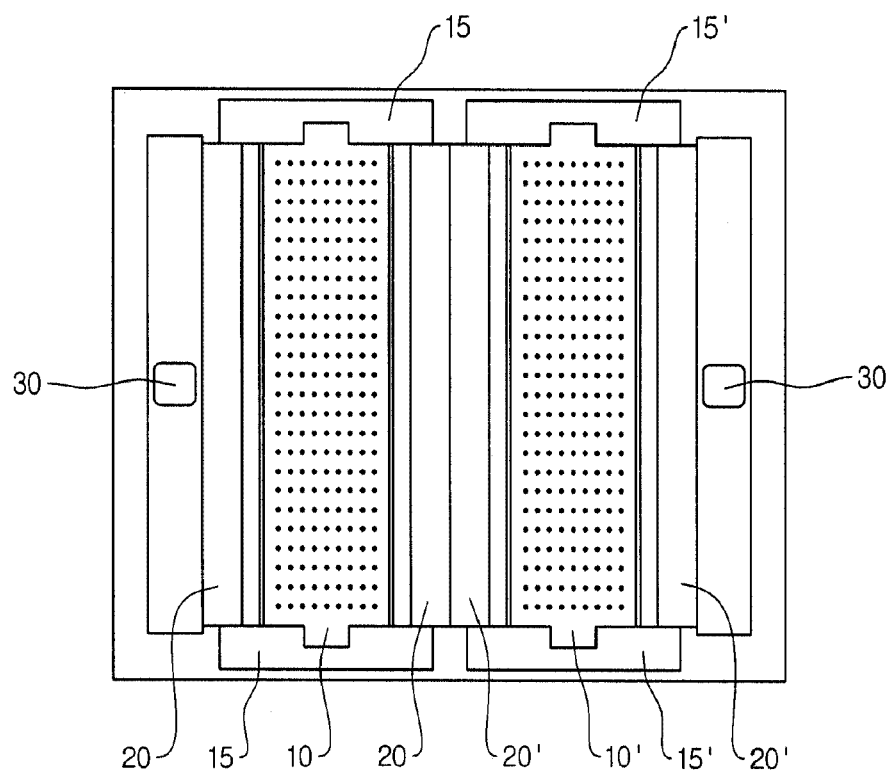
FIG. 8B shows a bottom view of the vapor deposition reactor of FIG. 8A.

In still another embodiment, as shown in FIGS. 8A and 8B, a vapor deposition reactor comprising a first electrode 10 and a second electrode 20 may be provided in parallel and in contact with another vapor deposition reactor comprising a first electrode 10' and a second electrode 20'. Thus, discharge ports 30 may be provided outside of the two second electrodes 20, 20', but not between the second electrodes 20, 20'. The two discharge ports 30 may have the same size.

Figure 9A:
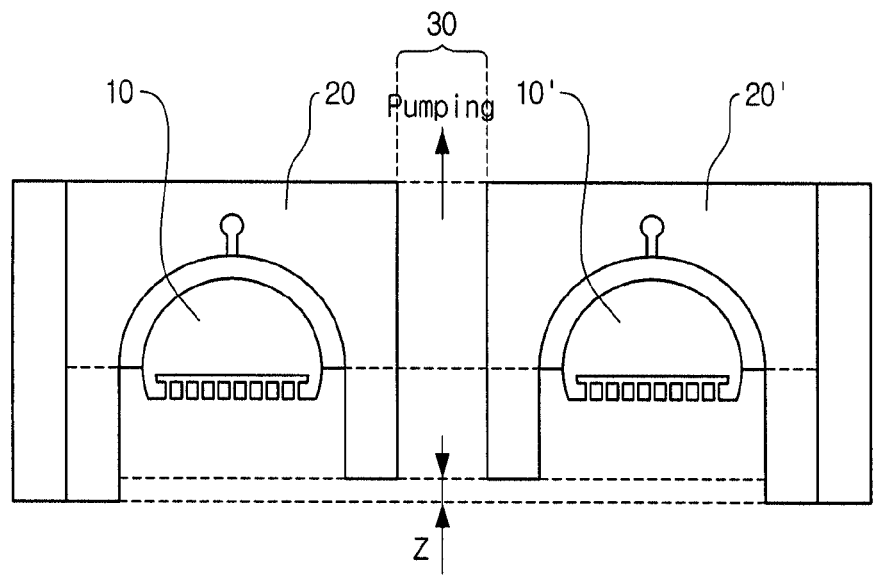
FIG. 9A shows a lateral cross-sectional view of still another vapor deposition reactor for performing a method for forming a thin film using radicals generated by plasma according to still another embodiment.
Figure 9B:
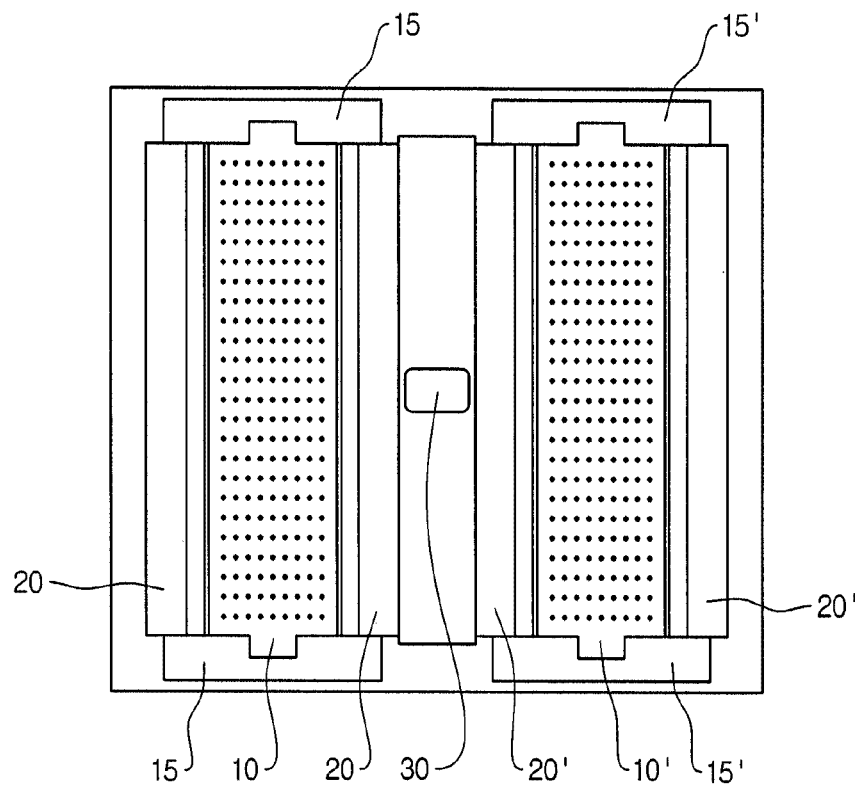
FIG. 9B shows a bottom view of the vapor deposition reactor of FIG. 9A.

FIG. 9A shows a lateral cross-sectional view of still another vapor deposition reactor for performing a method for forming a thin film using radicals generated by plasma according to still another embodiment. FIG. 9B shows a bottom view of the vapor deposition reactor of FIG. 9A.

Referring to FIGS. 9A and 9B, a vapor deposition reactor comprising a first electrode 10 and a second electrode 20 may be provided in parallel and in contact with another vapor deposition reactor comprising a first electrode 10' and a second electrode 20'. A discharge port 30 may be provided between the second electrodes 20, 20'. Each of the second electrodes 20, 20' may have different heights at an end portion adjacent to the discharge port 30 and an opposite end portion, such that a gap between a substrate (not shown) may be different at both ends. For example, a gap between the second electrodes 20, 20' and the substrate at a portion where the second electrodes 20, 20' are adjacent to the discharge port 30 may be relatively larger than a gap between the second electrodes 20, 20' and the substrate outside of the second electrodes 20, 20'.

Figure 10A:
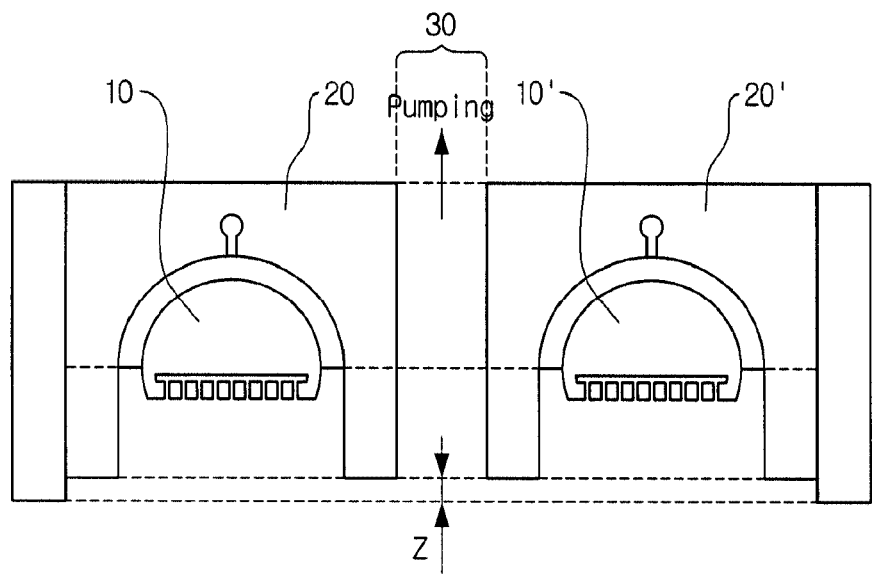
FIG. 10A shows a lateral cross-sectional view of still another vapor deposition reactor for performing a method for forming a thin film using radicals generated by plasma according to still another embodiment.
Figure 10B:
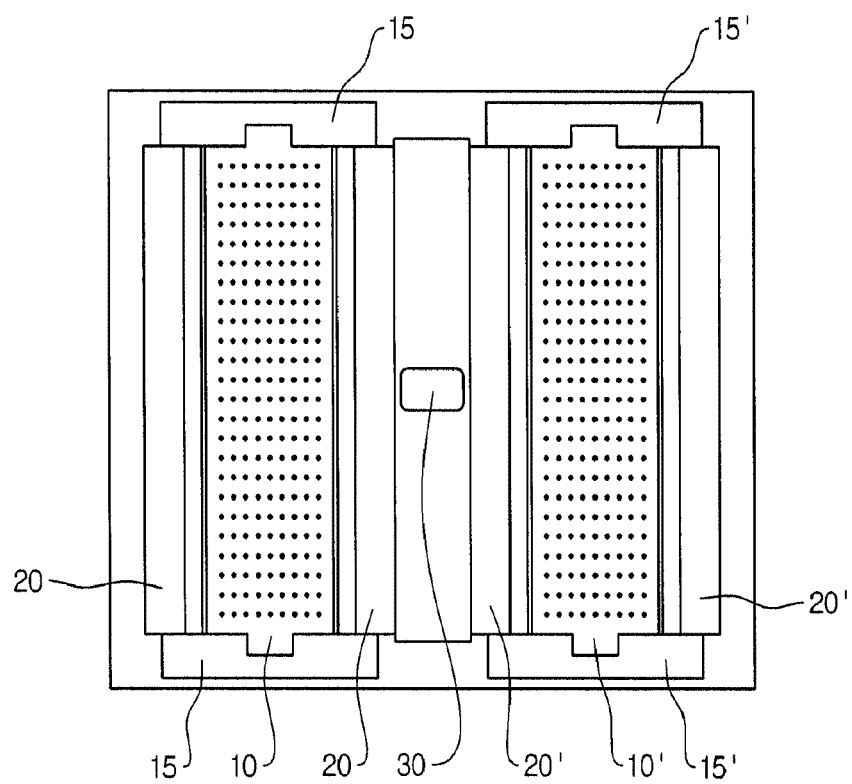
FIG. 10B shows a bottom view of the vapor deposition reactor of FIG. 10A.

In still another embodiment, as shown in FIGS. 10A and 10B, the both ends of the second electrodes 20, 20' may be configured to have the same height, such that the gap between the substrate may be identical.

The above-described types of the vapor deposition reactors are embodiments for performing the disclosed method for forming a thin film using radicals generated by plasma. The method for forming a thin film using radicals generated by plasma according to embodiments may be performed using appropriately modified other vapor deposition reactors, which fall within the scope of this disclosure.

In the method for forming a thin film using radicals generated by plasma according to embodiments, the source precursor is injected in between formation of the thin films by reaction of the radicals of the reactant precursor with the source precursor. Accordingly, a higher deposition rate may be achieved than the conventional plasma-enhanced atomic layer deposition (PEALD) process. Further, since the plasma or radicals of the reactant precursor, or injection amount and/or time of the source precursor may be controlled, composition and/or density, etc. of the thin film may be controlled through more deposition variables, and the disadvantages of the conventional PEALD process may be removed.

The methods for forming a thin film using radicals generated by plasma were described with reference to the flowcharts of various figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. It can be appreciated that various other branches, flow paths, and orders of blocks, may be implemented which achieve the same or similar result. Moreover, not all illustrated blocks may be required to implement the methodologies described herein.

While the embodiments have been shown and described, it will be understood by those skilled in the art that various changes in form and details may be made thereto without departing from the spirit and scope of this disclosure as defined by the appended claims. In addition, many modifications can be made to adapt a particular situation or material to the teachings of this disclosure without departing from the essential scope thereof. Therefore, it is intended that this disclosure not be limited to the particular embodiments disclosed as the best mode contemplated for carrying out this disclosure, but that this disclosure will include all embodiments falling within the scope of the appended claims.

What is claimed is:

1. A method for forming a thin film using radicals generated by plasma, comprising:
    making a first relative movement between a substrate and a deposition reactor in a direction parallel to a surface of the substrate for depositing the thin film;
    injecting a reactant precursor into a gap between a first electrode and a second electrode of the deposition reactor;
    generating radicals of the reactant precursor using plasma at the deposition reactor;
    injecting the source precursor into a region and another region within the deposition reactor via a channel formed in the first electrode;
    mixing the radicals with a source precursor in the region within the deposition reactor into first mixture;
    forming a first thin film on a portion of the surface of the substrate by exposing the portion of the surface of the substrate to the first mixture after making the first relative movement;
    making a second relative movement between the substrate and the deposition reactor in the direction parallel to the surface of the substrate;
    exposing the portion of the surface of the substrate to the source precursor that is not mixed with the radicals after making the second relative movement;
    making a third relative movement between the substrate and the deposition reactor in the direction parallel to the surface of the substrate;
    mixing the radicals with the source precursor in the other region within the deposition reactor into second mixture; and
    forming a second thin film on the first film by exposing the first film to the second mixture after making the third relative movement.

2. The method according to claim 1, further comprising:
    exposing the portion of the surface of the substrate to the radicals of the reactant precursor before forming the first thin film on the substrate.

3. The method according to claim 1, further comprising:
after forming the second thin film on the first film, exposing the second thin film to the radicals of the reactant precursor.

4. The method according to claim 1, further comprising:
removing materials physically adsorbed on the portion of the surface of the substrate before forming the first thin film on the portion of the surface of the substrate.

5. The method according to claim 1, further comprising:
after forming the second thin film on the substrate, removing materials physically adsorbed on the portion of the surface of the substrate.

6. The method according to claim 1, wherein forming the first thin film comprises:
causing reaction between the radicals of the reactant precursor and the source precursor.

7. The method according to claim 1, wherein forming the second thin film comprises:
causing reaction between the radicals of the reactant precursor and the source precursor.

8. The method of claim 1, wherein the first movement, the second movement and the third movement are continuous.

9. The method of claim 1, wherein the second electrode partially surrounds the first electrode.

10. The method of claim 9, wherein the first electrode has one or more injection ports formed on a surface facing away from the second electrode, the one or more injection ports injecting the source precursor into the region, the other region and onto the portion of the surface of the substrate.

11. A method for forming a thin film using radicals generated by plasma, comprising:
injecting reactant precursor into a gap between a first electrode and a second electrode of a deposition reactor;
generating radicals of the reactant precursor in the gap by applying voltage across the first electrode and the second electrode;
injecting the generated radicals towards a first region and a second region within the deposition reactor;
injecting a source precursor to the first region, the second region and a third region between the first region and the second region, wherein the third region is not injected with the generated radicals;
mixing the source precursor and the source precursor in the first region to form first mixture;
mixing the source precursor and the source precursor in the second region to form second mixture; and
exposing a portion of a surface of the substrate sequentially to the first mixture from the first region, the source precursor from the third region and the second mixture from the second region by moving the substrate relative to the first electrode and the second electrode in a direction parallel to the surface of the substrate to form a first layer and a second layer on the first layer, the first layer having composition different from the second layer.

12. The method according to claim 11, wherein exposing the substrate further comprises:
exposing a portion of the surface of the substrate to the radicals of the reactant precursor before forming the first thin film on the portion of the surface of the substrate.

13. The method according to claim 11, wherein exposing the substrate further comprises:
after forming the second thin film on a portion of the surface of the substrate, exposing the second thin film to the radicals of the reactant precursor.

14. The method according to claim 11, wherein exposing the substrate further comprises:
removing materials physically adsorbed on a portion of the surface of the substrate.

15. The method of claim 11, further comprising injecting the source precursor into a channel extending longitudinally across the second electrode, wherein the second electrode extends in a direction perpendicular to the direction in which the substrate and second electrode makes a relative movement.

16. The method of claim 11, wherein the first and second electrodes extend longitudinally in a direction perpendicular to the direction in which the substrate moves relative to the first and second electrodes.

17. The method of claim 11, wherein the first electrode has a channel formed therein for injecting the source precursor towards the substrate, and the second electrode partially surrounds the first electrode.

18. The method of claim 11, further comprising repeating injection of the reactant precursor, generation of the radicals, injection of the generated radicals, injection of the source precursor, mixing in the first region, mixing in the second region, and exposing the portion of the surface of the substrate.

* * * * *